United States Patent
Yan et al.

(10) Patent No.: US 9,887,631 B2
(45) Date of Patent: Feb. 6, 2018

(54) CURRENT SAMPLING METHOD AND CURRENT SAMPLING APPARATUS FOR ISOLATED POWER CONVERTER

(71) Applicant: Delta Electronics (Shanghai) CO., LTD, Shanghai (CN)

(72) Inventors: Chao Yan, Shanghai (CN); Liping Sun, Shanghai (CN); Jianjun Ni, Shanghai (CN); Baochen Wang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 221 days.

(21) Appl. No.: 14/749,797

(22) Filed: Jun. 25, 2015

(65) Prior Publication Data

US 2015/0381061 A1   Dec. 31, 2015

(30) Foreign Application Priority Data

Jun. 25, 2014   (CN) .......................... 2014 1 0292869

(51) Int. Cl.
*H02M 3/335* (2006.01)
*G01R 19/22* (2006.01)
*H02M 1/00* (2006.01)

(52) U.S. Cl.
CPC ........ *H02M 3/33546* (2013.01); *G01R 19/22* (2013.01); *H02M 3/335* (2013.01);
(Continued)

(58) Field of Classification Search
CPC ............. H02M 3/335; H02M 3/33546; H02M 2001/0009; H02M 2001/0058; G01R 19/22; G01R 19/02
See application file for complete search history.

(56) References Cited

U.S. PATENT DOCUMENTS 5,767,744 A    6/1998  Irwin et al.
6,765,808 B1 *  7/2004  Jin .................... H02M 3/33523
                                                363/131
(Continued)

FOREIGN PATENT DOCUMENTS

CN    102412726 A    4/2012
CN    102904457 A    1/2013
(Continued)

OTHER PUBLICATIONS

Office Action dated Mar. 30, 2016 by the TW Office.
1st Office Action dated May 24, 2017 by the CN Office.

*Primary Examiner* — Fred E Finch, III
*Assistant Examiner* — Rafael O De Leon Domenech
(74) *Attorney, Agent, or Firm* — Yunling Ren

(57) ABSTRACT

Disclosed are a current sampling apparatus and a current sampling method for an isolated power converter. The isolated power converter includes a square wave generator, an isolated transformer, and a primary side filter circuit coupled therebetween. The current sampling apparatus includes: a first sampling circuit coupled to the primary side of the isolated transformer and sampling a total current of the primary side of the isolated transformer and outputting a first sampling current; and a shunt circuit receiving the first sampling current. The shunt circuit includes a first shunt branch circuit through which the first sampling current is transformed into an excitation sampling current and a second shunt branch circuit through which the first sampling current is transformed into a current to be sampled.

18 Claims, 7 Drawing Sheets

(52) U.S. Cl.
CPC .............. *H02M 2001/0009* (2013.01); *H02M 2001/0058* (2013.01); *Y02B 70/1491* (2013.01)

(56) References Cited

U.S. PATENT DOCUMENTS

| | | |
|---|---|---|
| 2003/0043599 A1 | 3/2003 | Duerbaum |
| 2007/0165426 A1 | 7/2007 | Kyono |
| 2012/0268971 A1 | 10/2012 | Kim |
| 2013/0016533 A1 | 1/2013 | Halberstadt |
| 2015/0109824 A1* | 4/2015 | Chen ....................... H02M 3/22 363/17 |
| 2015/0207419 A1* | 7/2015 | Kyono .............. H02M 3/33507 363/17 |

FOREIGN PATENT DOCUMENTS

| | | |
|---|---|---|
| EP | 2546968 A1 | 1/2013 |
| JP | 2000023457 A | 1/2000 |
| JP | 2011254611 A | 12/2011 |
| TW | I338996 B | 3/2011 |
| TW | 201417466 A | 5/2014 |

* cited by examiner

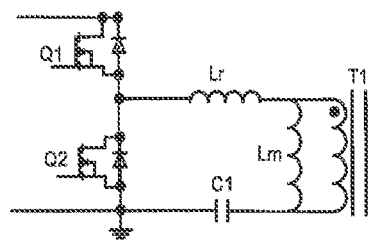
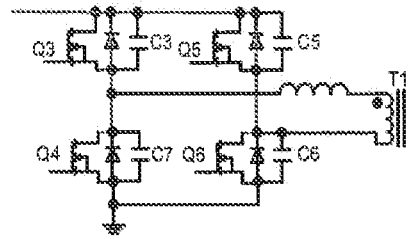
Fig. 4　　　　　　　　Fig. 5
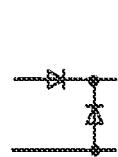
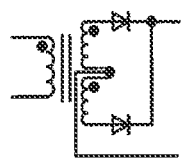
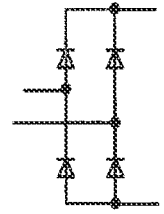
Fig. 6　　　Fig. 7　　　Fig. 8
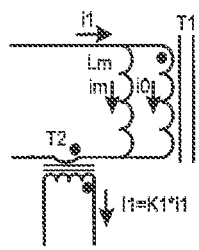
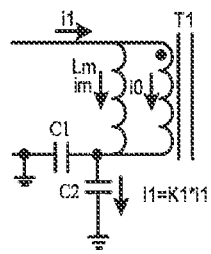
Fig. 9　　　　　　　　Fig. 10

CURRENT SAMPLING METHOD AND CURRENT SAMPLING APPARATUS FOR ISOLATED POWER CONVERTER

TECHNICAL FIELD

The present application relates to current sampling technology for a power converter, and more particularly to a current sampling method and a current sampling apparatus for an isolated power converter.

BACKGROUND

Generally, for a power converter, an output current needs to be monitored to obtain a present operation status of the power converter in real time. For a power converter, a typical sampling method is coupling a sampling circuit to an output end of the power converter to sample a voltage or a current at the output end of the power converter. Sampling at the output end of the power converter is generally used in current sharing control or overcurrent protection for the power converter and reporting of a load current or a load power to a power supply system. Among power converters, there is one type of power converters which utilize isolated transformers and may be referred to as isolated power converters. For such an isolated power converter, to sample at an output end is typically to sample electric parameters at a secondary side of the isolated transformer.

SUMMARY

Some embodiments of the present application provide a current sampling method and a current sampling apparatus for an isolated power converter, and an isolated power converter in which the isolated power converter is applied.

Some embodiments of the present application provide a current sampling apparatus for an isolated power converter. The isolated power converter includes a square wave generator, a primary side filter circuit and an isolated transformer; wherein, the primary side filter circuit is coupled between a primary side of the isolated transformer and the square wave generator. The current sampling apparatus includes: a first sampling circuit and a shunt circuit. The first sampling circuit is coupled to the primary side of the isolated transformer, and samples a total current of the primary side of the isolated transformer, and outputs a first sampling current. The shunt circuit receives the first sampling current, and includes a first shunt branch circuit and a second shunt branch circuit. The first sampling current is transformed into an excitation sampling current and a current to be sampled respectively through the first shunt branch circuit and the second shunt branch circuit. The excitation sampling current is in proportion to an excitation current passing through an excitation inductor at the primary side of the isolated transformer, and the current to be sampled is in proportion to a transmitted current transmitted from the primary side of the isolated transformer to a secondary side of the isolated transformer.

Some embodiments of the present application also provide an isolated power converter, including the above current sampling apparatus.

Some embodiments of the present application also provide a current sampling method for an isolated power converter, including: providing an isolated power converter, the isolated power converter including at least one isolated transformer; sampling a total current at a primary side of the isolated transformer to obtain a total sampling current at the primary side of the isolated transformer; shunting the total sampling current into an excitation sampling current and a current to be sampled, wherein, the excitation sampling current is in proportion to an excitation current at the primary side of the isolated transformer, and the current to be sampled is in proportion to a current at a secondary side of the isolated transformer; and obtaining a sampling of the current of the secondary side of the isolated transformer through a proportion between the current to be sampled and the current at the secondary side of the isolated transformer.

BRIEF DESCRIPTION OF THE DRAWINGS

FIG. 4 to FIG. 5 are schematic diagrams respectively showing a square wave generator of the current sampling apparatus according to embodiments of the present application;

FIG. 6 to FIG. 8 are schematic diagrams respectively showing a rectification circuit of the current sampling apparatus according to embodiments of the present application;

FIG. 9 to FIG. 10 are schematic diagrams respectively showing a first sampling current of the current sampling apparatus according to embodiments of the present application;

DETAILED DESCRIPTION

Figure 1:
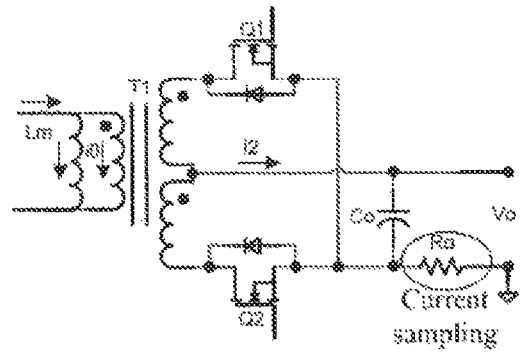
FIG. 1 is a schematic diagram showing a current output circuit for sampling by a resistor in the related arts.

Taking sampling at a secondary side of an isolated transformer as example, a currently popular method is connecting a resistor in series at an output end. As shown in FIG. 1, a current i1 passing through a primary side of a transformer T1 is divided into two parts, of which one part is a current im passing through an excitation inductance Lm, and the other part is a transmitted current i0. After synchronous rectification of Q1 and Q2 at a secondary side, a current i2 is further obtained to be transmitted to an output end. A resistor Ro is connected in series at the output end to sample the current. Although sampling by a resistor is advantageous in that it is simple, accurate and reliable, some loss will occur, particularly in cases where an output current is large such as for a power supply of a server, and loss in the resistor is particularly significant. Moreover, loss occurred in sampling by a resistor will be increased with the increase of an output load.

In cases where efficiency is expected to be high, the above loss in sampling by a resistor is not negligible. Accordingly, for these cases, there is a need to further improve the current sampling, so as to enhance the operation efficiency of the power converter.

Figure 2:
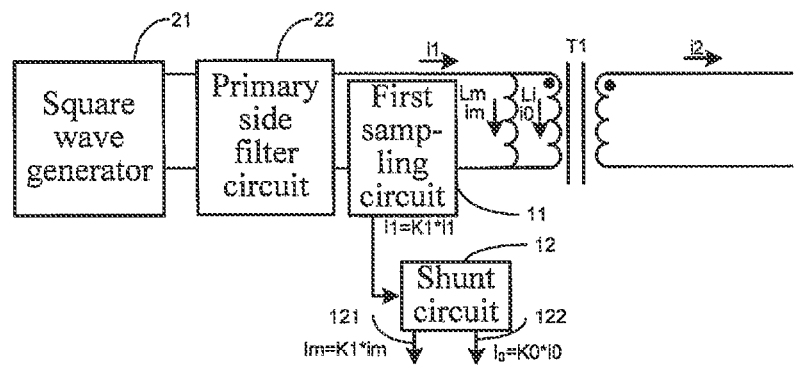
FIG. 2 is a block diagram showing a current sampling apparatus for an isolated power converter according to a first embodiment of the present application.

Hereinafter, specific embodiments of the present application will be described in detail. It should be noted that, the embodiments described herein are merely for illustration, and are not for limitation to the present application. FIG. 2 is a block diagram showing a current sampling apparatus for an isolated power converter according to a first embodiment of the present application. As shown in the Figure, an isolated power converter in which the current sampling apparatus of this embodiment is applied includes a square wave generator 21, a primary side filter circuit 22 and an isolated transformer T1. As well known to those skilled in the art, a primary side of the transformer T1 typically includes an excitation inductor Lm and a primary leakage inductor Li connected in parallel with the excitation inductor Lm.

As shown in FIG. 2, the current sampling apparatus of this embodiment is provided at the primary side of the transformer T1, and includes a first sampling circuit 11 and a shunt circuit 12. The first sampling circuit 11 is coupled to the primary side of the isolated transformer T1, and samples a total current of the primary side of the isolated transformer T1 and outputs a first sampling current I1. The shunt circuit 12 receives the first sampling current I1, and includes a first shunt branch circuit 121 and a second shunt branch circuit 122. Further, a part of the first sampling circuit I1 passing the first shunt branch circuit 121 and the other part of the first sampling circuit I1 passing the second shunt branch circuit 122 are respectively transformed into an excitation sampling current Im and a current I0 to be sampled. The excitation sampling current Im is in proportion to an excitation current im of the excitation inductor Lm, and the current I0 to be sampled is in proportion to a transmitted current i0 transmitted from the primary side of the transformer T1 to the secondary side thereof.

In one embodiment, after the first sampling current I1 passes through the shunt circuit I2, a ratio between the excitation sampling current Im and the excitation current im may equal to a ration between the current I0 to be sampled and the transmitted current i0. That is, $$Im/im=I0/i0=I1/i1=K1 \quad (1)$$

K1 is a sampling coefficient of the first sampling circuit I1. In this embodiment, the shunt circuit 12 only serves to shunt the current, and the formula (1) may be obtained after the shunting. Needless to say, in shunt circuits of other embodiments, the ratio K1 between the excitation sampling current Im and the excitation current im may not equal to a ratio K0 between the current I0 to be sampled and the transmitted current i0. Through inspiration from the above embodiments, it is easy for those skilled in the art to implement an excitation sampling current and a current to be sampled with a different ratio. Accordingly, other examples will not be given. Hereinafter, description will be given to the example applying the formula (1).

Figure 3:
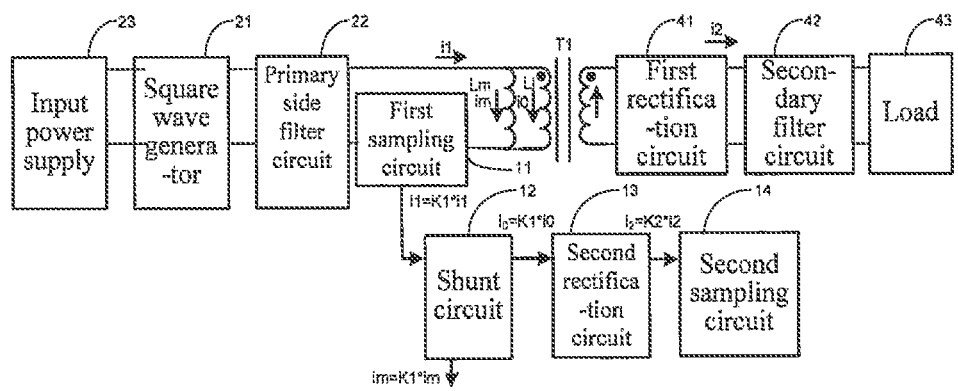
FIG. 3 is a block diagram showing a current sampling apparatus for an isolated power converter according to a second embodiment of the present application.

FIG. 3 is a block diagram showing a current sampling apparatus for an isolated power converter according to a second embodiment of the present application. As shown in FIG. 3, compared with the first embodiment, an isolated power converter in which the current sampling apparatus of this embodiment is applied includes an input power supply 23, a first rectification circuit 41, a secondary filter circuit 42 and a load 43, in addition to the square wave generator 21, the primary side filter circuit 22 and the isolated transformer T1. The square wave generator 21 generates a square wave voltage and outputs it according to an input from the input power supply 23. The primary side filter circuit 22 is configured to filter a ripple current from an output of the square wave generator 21. The first rectification circuit 41 is configured to transform an alternate current output from the secondary side of the transformer T1 into a direct current. The secondary filter circuit 42 is configured to filter a ripple current from an output of the first rectification circuit 41. An output of the secondary filter circuit 42 is coupled to the load 43.

As shown in FIG. 3, a current sampling apparatus of this embodiment includes a second rectification circuit 13 and a second sampling circuit 14, in addition to the first sampling circuit 11 and the shunt circuit 12. The second rectification circuit 13 receives the current I0 to be sampled output from the shunt circuit 12, and outputs a current in proportion to an output current i2 (after rectification) from the secondary side of the transformer T1. The second sampling circuit 14 samples an output current from the second rectification circuit 13 and outputs a second sampling current I2. In one embodiment, the second sampling circuit 14 may be implemented as a sampling resistor.

In one embodiment, the value of the second sampling current I2 and the value of the output current i2 (after rectification by the first rectification circuit 41) from the secondary side of the transformer T1 satisfy the following relationship formula:

$$I2=K2 \times i2 \quad (2)$$

As shown in FIG. 3, the second sampling current I2 of the second sampling circuit 14 is in proportion to the output current i2 from the secondary side of the transformer T1, and a coefficient is K2. Accordingly, by measuring the current passing through the second sampling circuit 14, the load current of the power converter may be obtained. By adjusting K2, the current passing through the second sampling circuit 14, such as a sampling resistor, may be adjusted. In this way, compared with the sampling method of coupling a sampling circuit to the output end of the power converter in the related art, in the current sampling apparatus illustrated in the present application, loss of the sampling circuit may be reduced by reducing the value of K2.

In one embodiment, the above square wave generator 21 may be implemented as a LLC resonant circuit shown in FIG. 4, and may also be implemented as a phase-shifted full-bridge circuit as shown in FIG. 5. In one embodiment, the first rectification circuit 41 may be implemented as a half-wave rectification circuit shown in FIG. 6, or may be implemented as a full-wave rectification circuit shown in FIG. 7, and may be also implemented as a full-bridge rectification circuit shown in FIG. 8.

In one embodiment, the above sampling circuit 11 may be implemented as a sampling circuit with a current inductor as shown in FIG. 9, and may also be implemented as a sampling circuit with a capacitor shown in FIG. 10.

As shown in FIG. 9, the total current i1 of the primary side of the isolated transformer T1 is sampled by a current inductor T2. If a turn ratio 1:m of the current inductor T2 is set to satisfy the following relationship formula:

$$1/m=K1 \quad (3)$$

so as to obtain the first sampling current:

$$I1=K1 \times i1 \quad (4)$$

As shown in FIG. 10, in this embodiment, the primary side filter circuit 22 is implemented as a filter capacitor C1, and a capacitor sampling circuit includes a sampling capacitor C2. One end of the sampling capacitor C2 is connected to one end of the filter capacitor C1, and the other end of the sampling capacitor C2 is an output end of the capacitor sampling circuit. The values of the sampling capacitor C2 and the filter capacitor C1 satisfy the following relationship formula:

$$C2/C1=K1 \quad (5)$$

so as to obtain the first sampling current I1 which also satisfies the above relationship formula (3).

It can be seen from the above two embodiments shown in FIG. 2 and FIG. 3, the first sampling current I1 is a result obtained by sampling the total current i1 of the primary side of the isolated transformer T1 with the first sampling coefficient K1, and the second sampling current I2 is a result obtained by sampling the output current i2 of the secondary side of the transformer T1 at the second sampling coefficient K2. Since the total current i1 of the primary side of the isolated transformer T1 includes two components, i.e. the excitation current im of the excitation inductor Lm and the transmitted current i0 transmitted from the primary side of the transformer T1 to the secondary side thereof, if the second sampling current I2 in proportion to the output current i2 (i2 is in proportion to i0) of the secondary side of the transformer T1 needs to be obtained, the shunt circuit 12 will be needed to shunt the current into the excitation sampling current Im and the current I0 to be sampled respectively corresponding to the excitation current im and the transmitted current i0.

Figure 11:
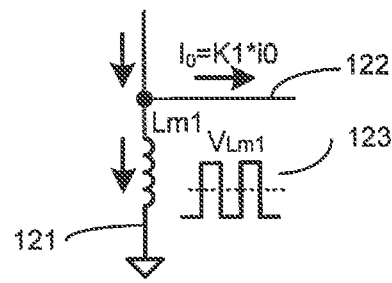
FIG. 11 is a schematic diagram showing a shunt circuit of the current sampling apparatus according to embodiments of the present application.

In one embodiment, the operation of the shunt circuit I2 is shown in FIG. 11. The shunt circuit I2 receives the first sampling current I1, and includes a first shunt branch circuit 121, a second shunt branch circuit 122 and a compensation voltage generation circuit 123. The first shunt branch circuit 121 includes a compensation inductor Lm1, a compensation voltage VLm1 generated by the compensation voltage generation circuit 123 is applied to both ends of the compensation inductor Lm1. The frequency of the compensation voltage VLm1 equals to that of an excitation voltage VLm across the excitation inductor Lm, and the amplitude of the compensation voltage VLm1 is in proportion to that of the excitation voltage VLm across the excitation inductor Lm (accordingly, the compensation voltage VLm1 is also a square voltage). Thereby, the excitation sampling current Im in proportion to the excitation current im and the current I0 to be sampled in proportion to the transmitted current i0 are obtained from the first shunt branch circuit 121 and the second shunt branch circuit 122 respectively.

Figure 12:
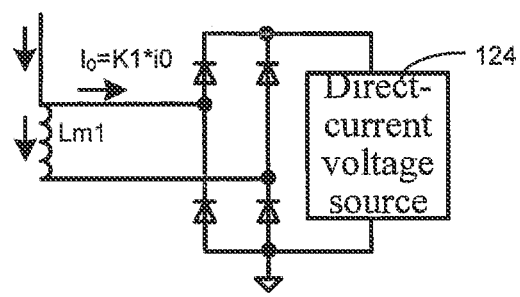
FIG. 12 to FIG. 14 are schematic diagrams respectively showing a compensation voltage generation circuit in the shunt circuit shown in FIG. 11.

In one embodiment, the above compensation voltage generation circuit 123 may be implemented as shown in FIG. 12, and mainly includes a full bridge rectification circuit composed of four diodes. The two ends of the compensation inductor Lm1 are respectively connected to middle points of two bridge arms of the full bridge rectification circuit, and an output end of the full bridge rectification circuit is in turn connected to a direct-current voltage source 124, such that the direct-current voltage source 124 generates a compensation voltage VLm1 applied to both ends of the compensation inductor Lm1.

Figure 13:
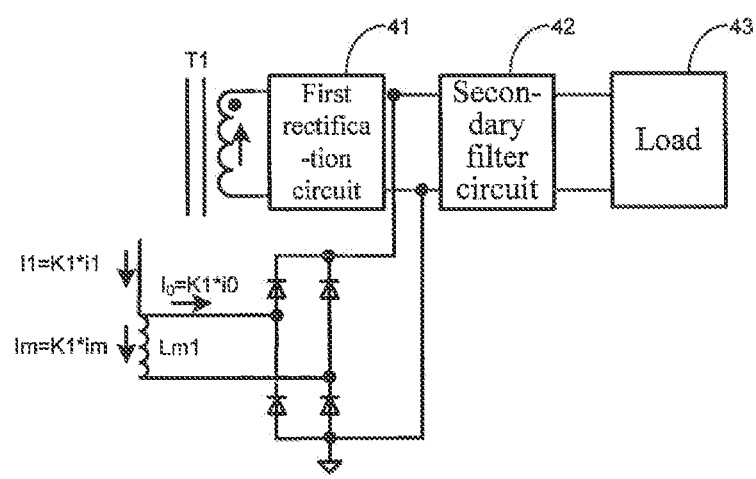

In one embodiment, the compensation voltage generation circuit 123 may be implemented as shown in FIG. 13, in which, the direct-current voltage source is provided by an output from the secondary side of the transformer T1 after rectification of the first rectification circuit 41. The embodiment shown in FIG. 15 below is implemented in this way. In the examples shown in FIGS. 12 and 13, the full bridge rectification circuit functions as the compensation voltage generation circuit 123, and also applies the compensation voltage VLm1 across the compensation inductor Lm1, and meanwhile, it also functions as the second rectification circuit 13 to rectify currents.

Figure 14:
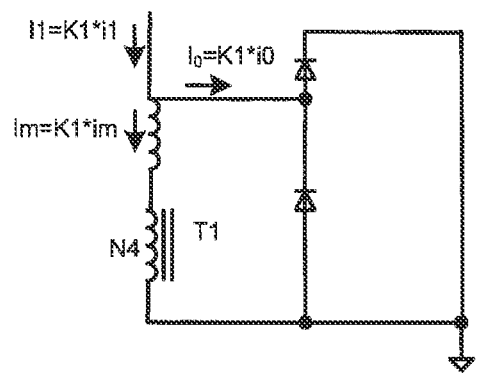
Figure 16:
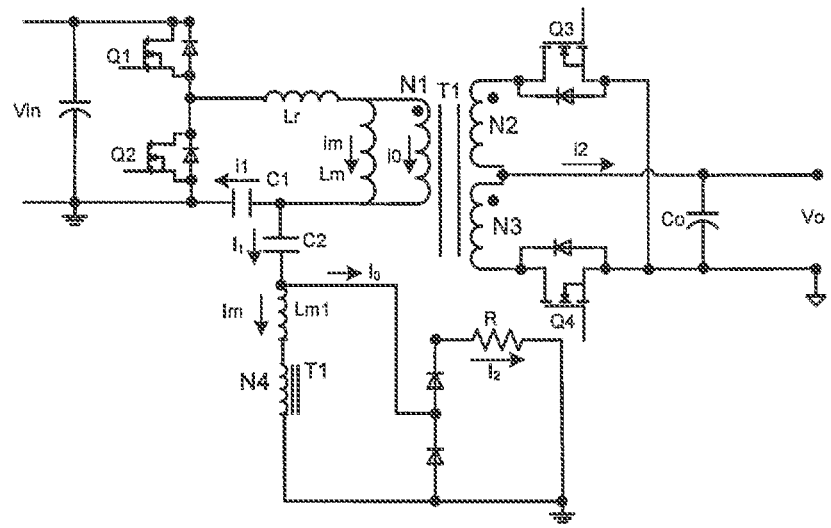
Figure 17:
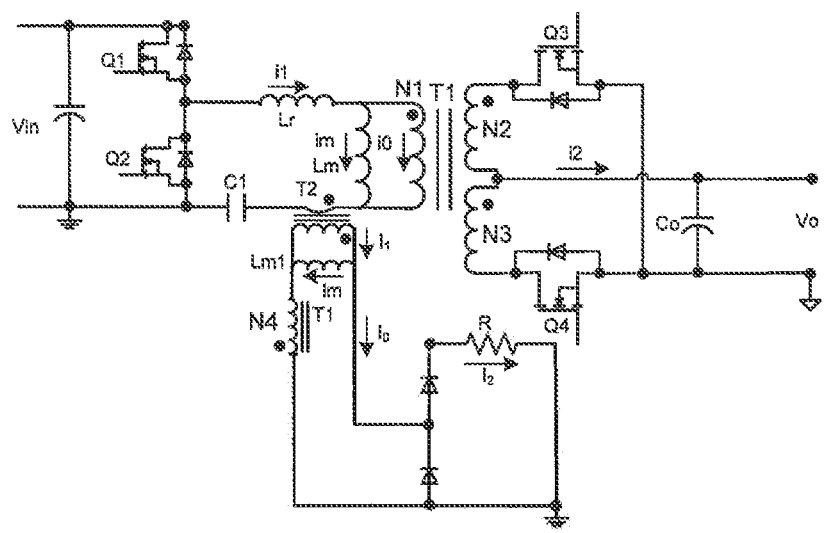

In one embodiment, the above compensation voltage generation circuit 123 may be implemented as shown in FIG. 14, in which, an auxiliary winding N4 is added to the primary side of the transformer T1, such that the compensation voltage VLm1 is obtained directly by coupling to the primary voltage of the transformer T1. The embodiments shown in FIGS. 16 and 17 are both implemented in this way. It should be noted that, being different form the embodiments shown in FIGS. 12 and 13, if the auxiliary winding N4 is sampled to apply the compensation voltage to the compensation inductor, the second rectification circuit will be needed to rectify the second shunt current, as shown in FIG. 14.

If the first sampling circuit is implemented with a current inductor, the compensation inductor Lm1 may be generated directly by a parasitic inductance of the current inductor itself.

In the shunt circuit 12 of the above embodiment, since the current I0 to be sampled on the second shunt branch circuit 122 is directly related to the accuracy of the second sampling current I2, in one embodiment, in order to secure the accuracy of the current I0 to be sampled, that is, in order to make the current I0 to be sampled satisfy the following relationship formula:

$$I0=K1\times i0 \quad (6)$$

the inductance value of the compensation inductor Lm1 needed to be set. Specifically, it is assumed that the amplitude of the excitation voltage applied to both ends of the excitation inductor Lm is VLm, and the amplitude of the square voltage applied to both ends of the excitation inductor Lm1 is VLm1, the following relationship formula may be satisfied:

$$I0=K1\times VLm/Lm=VLm1/Lm1 \quad (7)$$

Accordingly, the inductance value of the compensation inductor Lm1 may be expressed as the following relationship formula:

$$Lm1=(VLm1\times Lm)/(K1\times VLm) \quad (8)$$

Figure 18:
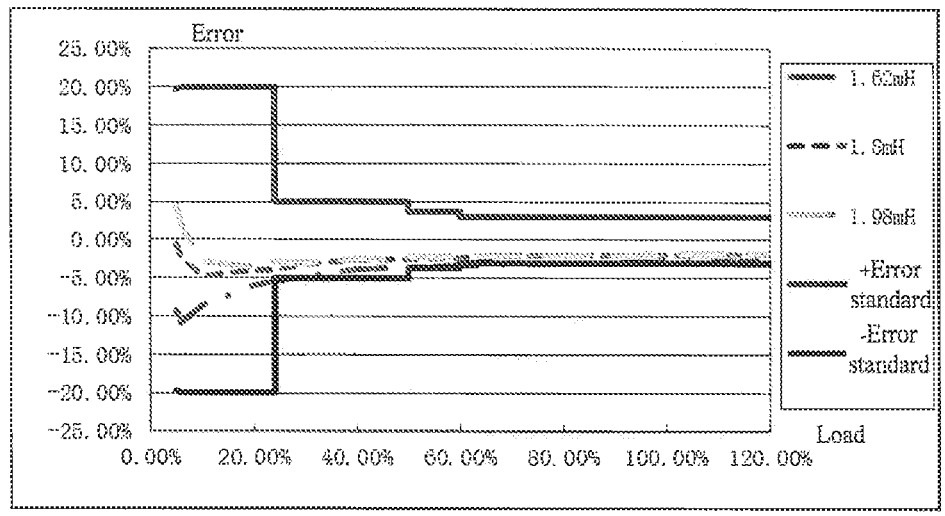
FIG. 18 and FIG. 19 are graphs showing a relationship between a value of a compensation inductor and a sampling accuracy of the shunt circuit shown in FIG. 11.
Figure 19:
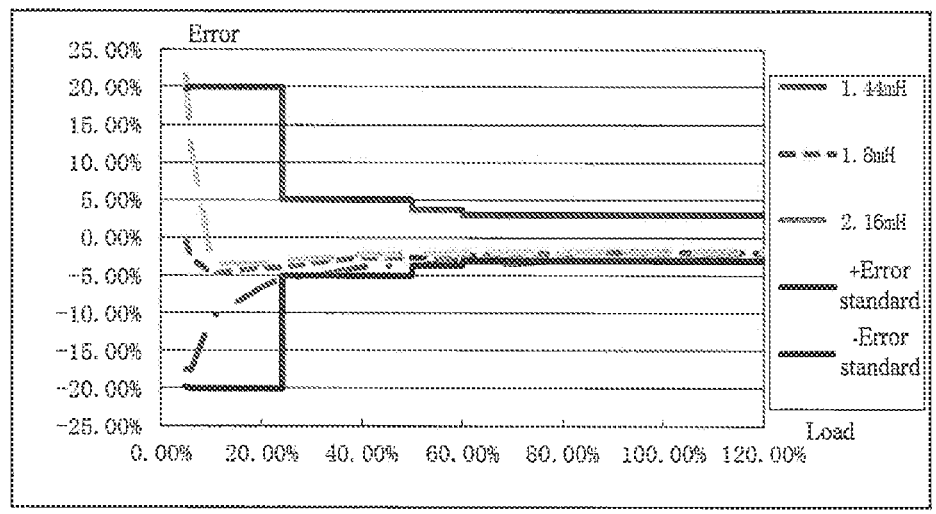

In practical application, taking a manufacture error of the excitation inductor Lm, a leakage inductance of the compensation inductor Lm1, influences from other devices in the circuit and the like into consideration, the inductance value of the compensation inductor Lm1 may be set in various ranges. FIGS. 18 and 19 are graphs respectively showing relationships between different values of the compensation inductor in the shunt circuit and sampling accuracies (that is the sampling accuracies of the second sampling current I2). In FIGS. 18 and 19, both of the horizontal ordinates represent loads coupled to the secondary side of the isolated transformer, varying from light loads to heavy loads (0.00%~120.00%), and both of the longitudinal ordinates represent errors between the actual measurements of the sampling current and a theoretical value. In FIGS. 18 and 19, the theoretically calculated compensation inductor is 1.8 mH. FIG. 18 shows the varied sampling errors corresponding to the compensation inductor values ranging between 90% and 110% as two end points (1.62 mH and 1.98 mH). FIG. 19 shows the varied sampling errors corresponding to the compensation inductor values ranging between 80% and 120% as two end points (1.44 m and 2.16 mH). As shown in the two Figures, if the sampling accuracy is to be secured within 5%, the inductance value of the compensation inductor Lm1 may be set between 100%×(VLm1×Lm)/(K1×VLm) and 110%×(VLm1×Lm)/(K1×VLm). If the sampling accuracy is to be secured between 10% and 5%, the inductance value of the compensation inductor Lm1 may be set between 90%×(VLm1×Lm)/(K1×VLm) and 100%×(VLm1×Lm)/(K1×VLm), or between 110%×(VLm1×Lm)/(K1×VLm) and 115%×(VLm1×Lm)/(K1×VLm). If the sampling accuracy is to be secured between 20% and 10%, the inductance value of the compensation inductor Lm1 may be set between 80%×(VLm1×Lm)/(K1×VLm) and 90%×(VLm1×Lm)/(K1×VLm), or between 115%×(VLm1×Lm)/(K1×VLm) and 120%×(VLm1×Lm)/(K1×VLm). Since the sampling accuracy tends to be influenced by the magnitude of the load, in practical application, the user may select a proper compensation inductor to satisfy the accuracy depending on the condition of the load of the circuit in normal operation, and the compensation inductors are not limited to those shown in FIGS. 18 and 19.

On the basis of the above description of the respective circuit parts of the current sampling apparatus of the present application, a specific circuit of the current sampling apparatus for an isolated power converter according to a first embodiment to a third embodiment of the present application will be described hereinafter with reference to FIGS. 15 to 17.

Figure 15:
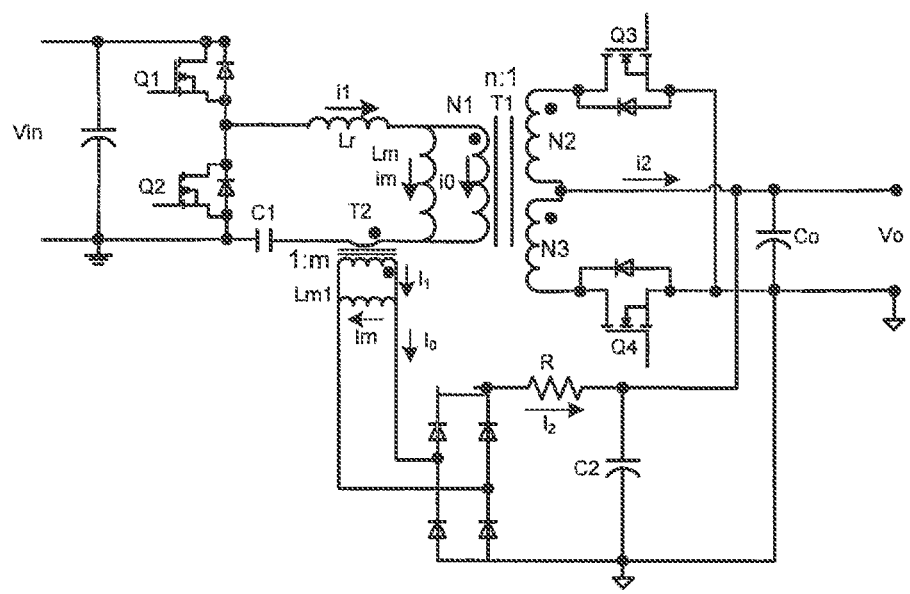
FIG. 15 to FIG. 17 are schematic diagrams respectively showing a circuit of the current sampling apparatus for an isolated power converter according to first to third embodiments of the present application.

FIG. 15 is a schematic diagram showing a specific circuit of the current sampling apparatus for an isolated power converter according to a first embodiment of the present application. The input voltage Vin is in parallel with a capacitor, and is connected to a bridge arm composed of switch transistors Q1 and Q2 in series. A positive end of Vin is connected to an upper bridge arm Q1; a negative end of Vin is connected to a lower bridge arm Q2; the middle point of the bridge arm is connected to one end of an inductor Lr; the other end of the inductor Lr is connected to one end of the primary side of the transformer T1; the other end of the primary side of the transformer T1 is connected to a capacitor C1; the other end of the capacitor C1 is connected to a negative end of Vin; the secondary side of the transformer T1 is a center-tapped full-wave synchronous rectification circuit; the two ends of the secondary side of T1 are respectively connected to one end of the switch transistor Q3 or Q4; the other ends of Q3 and Q4 are connected to each other and connected to a negative end of an output capacitor Co and grounded; and the center tap of the secondary side of T1 is connected to a positive end of Co.

In this embodiment, the first sampling circuit 11 is implemented as a current inductor T2 shown in FIG. 9, the compensation voltage generation circuit 123 is implemented as a full bridge rectification circuit shown in FIG. 13, and the second sampling circuit 14 is implemented as a sampling resistor R. As shown in FIG. 15, the current inductor T2 is connected in series between the capacitor C1 and the transformer T1, and the both ends of the compensation inductor Lm1 are respectively connected to the middle points of the two bridge arm of the full bridge rectification circuit. A cathode of a diode of the upper bridge arm of the full bridge rectification circuit is connected to the resistor R to sample the current. The resistor R is connected to positive ends of the capacitor C2 and an output voltage Vo of the power converter. Negative ends of the capacitor C2 and the output voltage Vo of the power converter are connected to an anode of a diode of the lower bridge arm of the full bridge rectification circuit and grounded.

As shown in FIG. 15, a turn ratio of the transformer T1 is N1:N2:N3=n:1:1, and a turn ratio of the inductor T2 is 1:m. In one embodiment, it is set to obtain m×n>10. According to the relationship between the turn ratios, the current of the secondary side of the current inductor T2, i.e. the first sampling current I1 satisfies the following relationship formula:

$$I1 = K \times i1 = i1/m \quad (9)$$

that is, to obtain the above relationship formula (3): K1=1/m.

Thereby, the following relationship formula may be obtained according to the above relationship formula (8):

$$Lm1 = m \times VLm1 \times Lm/VLm \quad (10)$$

On the other hand, VLm, VLm1 and VR across the sampling resistor R satisfy the following relationship formula:

$$VLm = n \times (VLm1 + VR) = n \times (VLm1 + I2 \times R) \quad (11)$$
$$= n \times (VLm1 + i2 \times R/(m \times n))$$

As described in the above, since m×n>10, the voltage VR across the sampling resistor R is negligible, thereby the relationship formula (11) may be simplified as:

$$VLm = n \times VLm1 \quad (12)$$

The relationship formula (10) and (12) may be combined to express the compensation inductor Lm1 as:

$$Lm1 = m \times Lm/n \quad (13)$$

In practical application, taking a manufacture error of the excitation inductor Lm, a leakage inductance of the compensation inductor Lm1, influences from other devices in the circuit and the like into consideration, the inductance value of the compensation inductor Lm1 may be set in various ranges. For example, if the sampling accuracy is to be secured within 5%, the inductance value of the compensation inductor Lm1 may be set between 100%×m×Lm/n and 110%×m×Lm/n. If the sampling accuracy is to be secured between 10% and 5%, the inductance value of the compensation inductor Lm1 may be set between 90%×m×Lm/n and 100%×m×Lm/n, or between 110%×m×Lm/n and 115%×m×Lm/n. If the sampling accuracy is to be secured between 20% and 10%, the inductance value of the compensation inductor Lm1 may be set between 80%×m×Lm/n and 90%×m×Lm/n, or between 115%×m×Lm/n and 120%×m×Lm/n.

In this embodiment, according to variations of current of the transformer T1 and the inductor T2, a current passing through the resistor R may be obtained as I2=i2/(m×n), such that averages I2_avg and i2_avg of the currents I2 and i2 satisfy the following relationship formula:

$$I2\_avg = i2\_avg/(m \times n) \quad (14)$$

In this way, by sampling the current passing through the sampling resistor R, a magnitude of the output current i2 of the secondary side of the transformer T1 may be obtained. Since m×n>10 is obtained during the design, given that the sampling resistor is same, a loss in the sampling resistor in the current sampling apparatus according to this embodiment is far less than that in the sampling resistor shown in FIG. 1.

FIG. 16 is a schematic diagram showing a specific circuit of the current sampling apparatus for an isolated power converter according to a second embodiment of the present application. As shown in the Figure, the isolated power converter of this embodiment is also implemented with a LLC half-bridge series resonant converter, therefore, the elements of the same parts will not be repeated.

In this embodiment, the first sampling circuit 11 is implemented as the capacitor sampling circuit shown in FIG. 10, the compensation voltage generation circuit 123 is implemented as the auxiliary winding N4 shown in FIG. 14, and the second sampling circuit 14 is also implemented as the sampling resistor R. As shown in the Figure, one end of the capacitor C2 is connected to where the capacitor C1 is connected with one end of the primary side of the transformer T1. The other end of the capacitor C2 is connected to one end of the compensation inductor Lm1, and connected to a middle point of the bridge arm of the rectification bridge composed of two diodes. The other end of the compensation inductor Lm1 is connected to one end of the winding N4. The other end of N4 is connected to the anode of the diode of the lower bridge arm. The sampling resistor K is connected with the diode bridge arm in parallel.

In this embodiment, the primary side and the secondary side of the transformer T1 has a turn ratio N1:N2:N3:N4=n:1:1:1, the capacitance values of the capacitors C1 and C2 is C2=C1/m (m>10), and during the design, it is set to obtain m×n>10. Thereby the current passing through the capacitor C2, i.e. the first sampling current I1 may also satisfy the relationship formula (9). Similarly, since the voltage across the sampling resistor R is negligible, inductance of the compensation inductor Lm1 may be also expressed as the above relationship formula (13).

Similarly, in practical application, taking a manufacture error of the excitation inductor Lm, a leakage inductance of the compensation inductor Lm1, influences from other devices in the circuit and the like into consideration, the inductance value of the compensation inductor Lm1 may be set in various ranges. For example, if the sampling accuracy is to be secured within 5%, the inductance value of the compensation inductor Lm1 may be set between 100%×m×Lm/n and 110%×m×Lm/n. If the sampling accuracy is to be secured between 10% and 5%, the inductance value of the compensation inductor Lm1 may be set between 90%×m×Lm/n and 100%×m×Lm/n, or between 110%×m×Lm/n and 115%×m×Lm/n. If the sampling accuracy is to be secured between 20% and 10%, the inductance value of the compensation inductor Lm1 may be set between 80%×m×Lm/n and 90%×m×Lm/n, or between 115%×m×Lm/n and 120%×m×Lm/n.

In this embodiment, the average current i2_avg of the output current of the secondary side of the transformer T1 and the average current I2_avg of the second sampling current I2 passing through the sampling resistor R respectively satisfy the following relationship formula:

$$i2\_avg=(i1-im)\_avg \times n \quad (15)$$

$$I2\_avg=(I1-Im)\_avg/2=(i1/m-im/m)\_avg/2 \quad (16)$$

Thereby, i2_avg and I2_avg may be obtained to satisfy the following relationship formula:

$$i2\_avg=I2\_avg/(2m \times n) \quad (17)$$

In this way, by sampling the current passing through the sampling resistor R, a magnitude of the output current i2 of the secondary side of the transformer T1 may be obtained. Since m×n>10 is obtained during the design, given that the sampling resistor is same, a loss in the sampling resistor in the current sampling apparatus according to this embodiment is far less than that in the sampling resistor shown in FIG. 1.

FIG. 17 is a schematic diagram showing a specific circuit of the current sampling apparatus for an isolated power converter according to a third embodiment of the present application. As shown in the Figure, the isolated power converter of this embodiment is also implemented with a LLC half-bridge series resonant converter shown in FIG. 15, therefore, the elements of the same parts will not be repeated.

In this embodiment, the first sampling circuit ills implemented as the current inductor T2 shown in FIG. 9, the compensation voltage generation circuit 123 is implemented as the auxiliary winding N4 shown in FIG. 14, and the second sampling circuit 14 is also implemented as the sampling resistor R. As shown in the Figure, the current inductor T2 is connected in series between the capacitor C1 and the transformer T1. One end of the compensation inductor Lm1 is connected to the middle point of the bridge arm of the rectification bridge composed of two diodes. The other end of the compensation inductor Lm1 is connected to one end of the winding N4. The other end of the winding N4 is connected to the anode of the diode of the lower bridge arm. The sampling resistor R is connected with the diode bridge arm in parallel.

In this embodiment, the primary side and the secondary side of the transformer T1 has a turn ratio N1:N2:N3:N4=n:1:1:1, a turn ratio of the inductor T2 is 1:m, and during the design, it is set to obtain m×n>10. Thereby the current of the secondary side of the current inductor T2, i.e. the first sampling current I1 may also satisfy the relationship formula (9). Similarly, since the voltage across the sampling resistor R is negligible, inductance of the compensation inductor Lm1 may be also expressed as the above relationship formula (13).

Similarly, in practical application, taking a manufacture error of the excitation inductor Lm, a leakage inductance of the compensation inductor Lm1, influences from other devices in the circuit and the like into consideration, the inductance value of the compensation inductor Lm1 may be set in various ranges. For example, if the sampling accuracy is to be secured within 5%, the inductance value of the compensation inductor Lm1 may be set between 1.00%×m×Lm/n and 110%×m×Lm/n. If the sampling accuracy is to be secured between 10% and 5%, the inductance value of the compensation inductor Lm1 may be set between 90%×m×Lm/n and 100%×m×Lm/n, or between 110%×m×Lm/n and 115%×m×Lm/n. If the sampling accuracy is to be secured between 20% and 10%, the inductance value of the compensation inductor Lm1 may be set between 80%×m×Lm/n and 90%×m×Lm/n, or between 115%×m×Lm/n and 120%×m×Lm/n.

In this embodiment, the average current i2_avg of the output current of the secondary side of the transformer T1 and the average current I2_avg of the second sampling current I2 passing through the sampling resistor R may be obtained to also satisfy the above relationship formula (17).

In this way, by sampling the current passing through the sampling resistor R, a magnitude of the output current i2 of the secondary side of the transformer T1 may be obtained. Since m×n>10 is obtained during the design, given that the sampling resistor is same, a loss in the sampling resistor in the current sampling apparatus according to this embodiment is far less than that in the sampling resistor shown in FIG. 1.

In the embodiments set forth above, in case where the formula of the average current I2_avg of the second sampling current I2 contains a number 2, such as the formula (16), the second rectification circuit in the sampling circuit is a half bridge rectification circuit, as shown in FIGS. 14, 16 and 17.

Figure 20:
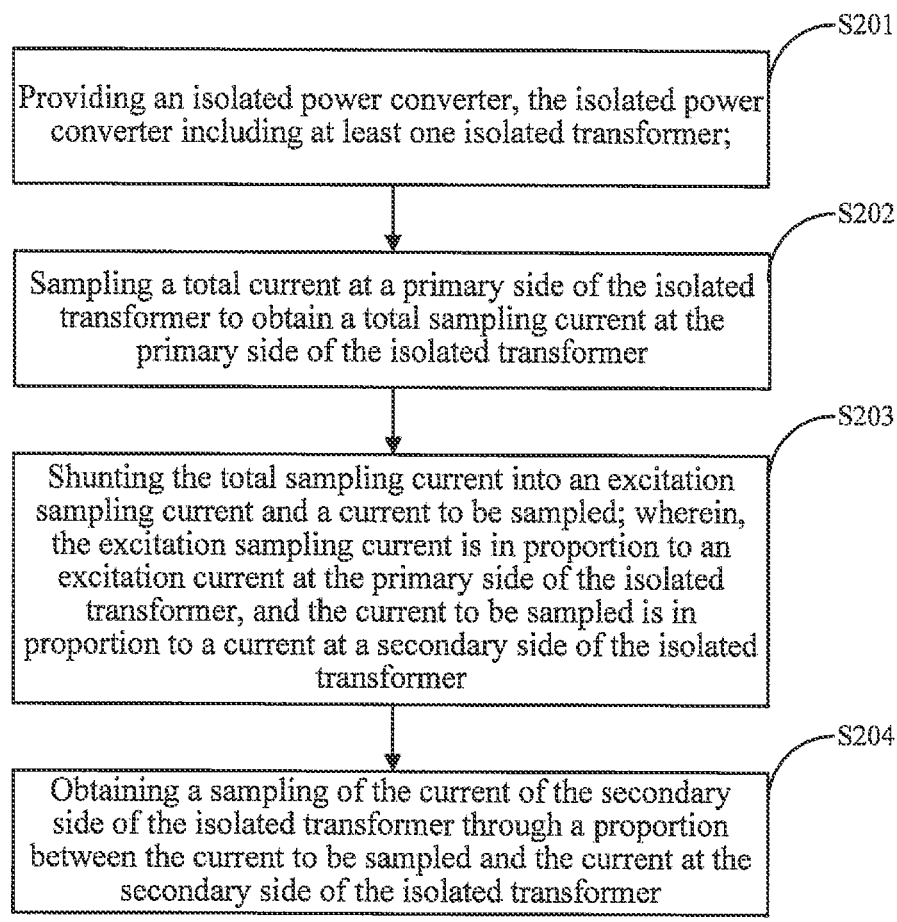
FIG. 20 is a flow chart showing a current sampling method for an isolated power converter according to embodiments of the present application.

A current sampling method for an isolated power converter is also provided by embodiments of the present application. As shown in FIG. 20, in one embodiment, the current sampling method of the present application includes the following steps S201-S204.

At S201, an isolated power converter is provided, and the isolated power converter includes at least one isolated transformer;

At S202, a total current at a primary side of the isolated transformer is sampled to obtain a total sampling current at the primary side of the isolated transformer;

At S203, the total sampling current is shunted into an excitation sampling current and a current to be sampled; the excitation sampling current is in proportion to an excitation current at the primary side of the isolated transformer, and the current to be sampled is in proportion to a current at a secondary side of the isolated transformer; and At S204, a sampling of the current of the secondary side of the isolated transformer is obtained through a proportion between the current to be sampled and the current at the secondary side of the isolated transformer.

It can be seen from the above technical solutions that, in the current sampling method and current sampling apparatus provided by the embodiments of the present application and the isolated power converter in which the isolated power converter is applied, by setting a sampling coefficient, the transmitted current of the primary side of the transformer of the power converter or the load current of the secondary side thereof is sampled, thereby a low sampling loss may be realized.

Although the present application has been describe with reference to several representative embodiments, it should be appreciated that, the terms used herein are illustrative, exemplary and unrestrictive. Since the present application may be specifically implemented in various forms without departing from the spirit and merit of the application, it should be appreciated that, the above embodiments are not limited to any details described above, but should be interpreted broadly within the spirit and scope defined by the appended claims. Therefore, all the variations and modifications falling within the claims and their equivalents should be covered by the appended claims.

What is claimed is:

1. A current sampling apparatus for an isolated power converter, the isolated power converter comprising a square wave generator, an isolated transformer, and a primary side filter circuit coupled therebetween, the current sampling apparatus comprising:
   a first sampling circuit coupled to the primary side of the isolated transformer and sampling a total current of the primary side of the isolated transformer and outputting a first sampling current; and
   a shunt circuit receiving the first sampling current and comprising:
      a first shunt branch circuit through which the first sampling current is transformed into an excitation sampling current, the excitation sampling current being in proportion to an excitation current passing through an excitation inductor at the primary side of the isolated transformer; and
      a second shunt branch circuit through which the first sampling current is transformed into a current to be sampled, the current to be sampled being in proportion to a transmitted current transmitted from the primary side of the isolated transformer to a secondary side of the isolated transformer.

2. The current sampling apparatus of claim 1, wherein, a ratio between the excitation sampling current and the excitation current at the primary side of the transformer equals to a ratio between the current to be sampled and the transmitted current at the secondary side of the transformer.

3. The current sampling apparatus of claim 1, wherein, the first shunt branch circuit comprises a compensation inductor; a compensation voltage is applied to both ends of the compensation inductor, and a frequency of the compensation voltage equals to a frequency of a voltage across the excitation inductor.

4. The current sampling apparatus of claim 3, wherein, the both ends of the compensation inductor are respectively connected to middle points of two bridge arms of a full bridge rectification circuit, and an output end of the full bridge rectification circuit is connected to a direct-current voltage source.

5. The current sampling apparatus of claim 4, wherein, the isolated power converter further comprises a first rectification circuit; the first rectification circuit is coupled to the secondary side of the transformer, and outputs the direct-current voltage source.

6. The current sampling apparatus of claim 4, wherein, the current sampling apparatus further comprises a second sampling circuit, coupled to the output end of the full bridge rectification circuit, and configured to sample an output current of the full bridge rectification circuit and output a second sampling current; the second sampling current and an output current of the secondary side of the transformer satisfy the following relationship formula:

$$I2 = K1 * i2/n$$

wherein, I2 and i2 are respectively the value of the second sampling current and the value of the output current of the secondary side of the transformer, K1 is a ratio between a value of the first sampling current and a value of the total current at the primary side of the isolated transformer, and n is a turn ratio of the transformer.

7. The current sampling apparatus of claim 3, wherein, the primary side of the transformer is coupled with an auxiliary winding; the auxiliary winding generates the compensation voltage.

8. The current sampling apparatus of claim 7, wherein, the current sampling apparatus further comprises a second rectification circuit, the second rectification circuit rectifies the current to be sampled.

9. The current sampling apparatus of claim 8, wherein, the current sampling apparatus further comprises a third sampling circuit, configured to sample an output current of the second rectification circuit and output a third sampling current, and a value of the third sampling current and a value of the output current of the secondary side of the transformer satisfy the following relationship formula:

$$I3 = K1 \times i2/n,$$

wherein, I3 and i2 are respectively the value of third sampling current and the value of the output current of the secondary side of the transformer, K1 is a ratio between a value of the first sampling current and a value of the total current at the primary side of the isolated transformer, and n is a turn ratio of the transformer.

10. The current sampling apparatus of claim 6, wherein, the output current of the full bridge rectification circuit or the output current of the second rectification circuit is less than 1/10 of the transmitted current of the secondary side of the transformer.

11. The current sampling apparatus of claim 3, wherein, a value Lm1 of the compensation inductor is between 80%×(VLm1×Lm)/(K1×VLm) and 120%×(VLm1×Lm)/(K1×VLm), wherein, VLm1 is an amplitude of the compensation voltage, Lm is an inductance of the excitation inductor, K1 is a ratio between a value of the first sampling current and a value of the total current at the primary side of the isolated transformer, and VLm is an amplitude of a voltage across the excitation inductor.

12. The current sampling apparatus of claim 1, wherein, a current of the secondary side of the transformer is greater than a current of the primary side of the transformer.

13. The current sampling apparatus of claim 1, wherein, the first sampling circuit comprises a current inductor, and a turn ratio 1:m of the current inductor satisfies the following relationship formula:

$$1/m = K1,$$

wherein, m is a natural number greater than 0, and K1 is a ratio between a value of the first sampling current and a value of the total current at the primary side of the isolated transformer.

14. The current sampling apparatus of claim 1, wherein, the primary side filter circuit comprises at least one filter capacitor.

15. The current sampling apparatus of claim 14, wherein, the first sampling circuit comprises a sampling capacitor; one end of the sampling capacitor is connected to one end of the filter capacitor, and the other end of the sampling capacitor is an output end of the first sampling circuit; and a value of the sampling capacitor and a value of the filter capacitor satisfy the following relationship formula:

$$C2 = K1 \times C1,$$

wherein, C1 and C2 are respectively a value of the filter capacitor and a value of the sampling capacitor, and K1 is a ratio between a value of the first sampling current and a value of the total current at the primary side of the isolated transformer.

16. A power converter, comprising:
a square wave generator connected with a power source and converted the power source to a square wave;
a controller applied to control the square wave generator;
an isolated transformer comprising at least a primary winding and a secondary winding;
a primary side filter circuit coupled between the square wave generator and the primary winding to receive the square wave;
a rectifier coupled with the secondary winding to provide a direct current for a load; and
a current sampling apparatus of claim 1, sampling a total current through primary winding to get a sample current and converting the sampled current to a final sample current proportional to the direct current provided by the rectifier and providing the final sample current to the controller.

17. A current sampling method for an isolated power converter, comprising:
providing an isolated power converter comprising at least one isolated transformer;
sampling a total current at a primary side of the isolated transformer to obtain a total sampling current at the primary side of the isolated transformer;
shunting the total sampling current into an excitation sampling current and a current to be sampled, the excitation sampling current being in proportion to an excitation current at the primary side of the isolated transformer, and the current to be sampled being in proportion to a current at a secondary side of the isolated transformer; and
obtaining a sampling of the current of the secondary side of the isolated transformer through a proportion between the current to be sampled and the current at the secondary side of the isolated transformer.

18. The current sampling method of claim 17, wherein, the current at the secondary side of the isolated transformer is greater than the total current at the primary side of the isolated transformer.

* * * * *